(12) United States Patent
Nishimura

(10) Patent No.: US 8,779,379 B2
(45) Date of Patent: Jul. 15, 2014

(54) ACQUISITION METHOD OF CHARGED PARTICLE BEAM DEFLECTION SHAPE ERROR AND CHARGED PARTICLE BEAM WRITING METHOD

(71) Applicant: NuFlare Technology, Inc., Numazu (JP)

(72) Inventor: Rieko Nishimura, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 13/850,677

(22) Filed: Mar. 26, 2013

(65) Prior Publication Data

US 2013/0264499 A1  Oct. 10, 2013

(30) Foreign Application Priority Data

Apr. 5, 2012 (JP) ................................. 2012-086414
Sep. 10, 2012 (JP) ................................. 2012-198858

(51) Int. Cl.
  *H01J 37/147* (2006.01)
  *H01J 37/304* (2006.01)

(52) U.S. Cl.
  USPC ................... 250/400; 250/492.22; 250/492.2; 250/398

(58) Field of Classification Search
  USPC ............. 250/396 R, 398–400, 492.2–492.22, 250/492.3
  See application file for complete search history.

(56) References Cited

U.S. PATENT DOCUMENTS

| | | | |
|---|---|---|---|
| 2008/0078947 A1* | 4/2008 | Horiuchi et al. | 250/492.2 |
| 2009/0008568 A1* | 1/2009 | Abe | 250/396 R |
| 2010/0288939 A1* | 11/2010 | Nishimura | 250/397 |
| 2011/0031387 A1* | 2/2011 | Nakayamada et al. | 250/252.1 |
| 2012/0211676 A1* | 8/2012 | Kamikubo | 250/492.22 |

FOREIGN PATENT DOCUMENTS

JP 2011-228498 11/2011

* cited by examiner

*Primary Examiner* — Nicole Ippolito
*Assistant Examiner* — David E Smith
(74) *Attorney, Agent, or Firm* — Oblon, Spivak, McClelland, Maier & Neustadt, L.L.P.

(57) ABSTRACT

An acquisition method of a charged particle beam deflection shape error includes writing a plurality of figure patterns, each smaller than a deflection region of a plurality of deflection regions, with charged particle beams, at a pitch different from an arrangement pitch of the plurality of deflection regions to be deflected by a deflector that deflects the charged particle beams, synthesizing writing positions of the plurality of figure patterns into one virtual deflection region of the same size as the deflection region, based on a positional relationship between the deflection region including a position where a figure pattern concerned of the plurality of figure patterns has been written and the position where the figure pattern concerned has been written, and calculating, to output, a shape error in the case of writing a pattern in the deflection region, using a synthesized writing position of each of the plurality of figure patterns.

16 Claims, 10 Drawing Sheets

ACQUISITION METHOD OF CHARGED PARTICLE BEAM DEFLECTION SHAPE ERROR AND CHARGED PARTICLE BEAM WRITING METHOD

CROSS-REFERENCE TO RELATED APPLICATION

This application is based upon and claims the benefit of priority from the prior Japanese Patent Application No. 2012-086414 filed on Apr. 5, 2012 in Japan, and the prior Japanese Patent Application No. 2012-198858 filed on Sep. 10, 2012 in Japan the entire contents of which are incorporated herein by reference.

BACKGROUND OF THE INVENTION

1. Field of the Invention

The present invention relates to an acquisition method of a charged particle beam deflection shape error, and a charged particle beam writing method.

2. Description of Related Art

The lithography technique that advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a highly precise master pattern.

FIG. 8 is a schematic diagram explaining operations of a variable shaped electron beam (EB) writing or "drawing" apparatus. As shown in the figure, the variable shaped electron beam writing apparatus operates as described below. A first aperture plate 410 has a quadrangular opening 411 for shaping an electron beam 330. A second aperture plate 420 has a variable-shape opening 421 for shaping the electron beam 330 having passed through the opening 411 of the first aperture plate 410 into a desired quadrangular shape. The electron beam 330 emitted from a charged particle source 430 and having passed through the opening 411 is deflected by a deflector to pass through a part of the variable-shape opening 421 of the second aperture plate 420, and thereby to irradiate a target object or "sample" 340 placed on a stage which continuously moves in one predetermined direction (e.g. the x direction) during the writing. In other words, a quadrangular shape that can pass through both the opening 411 and the variable-shape opening 421 is used for pattern writing in a writing region of the target object 340 on the stage continuously moving in the x direction. This method of forming a given shape by letting beams pass through both the opening 411 of the first aperture plate 410 and the variable-shape opening 421 of the second aperture plate 420 is referred to as a variable shaped beam (VSB) method.

FIG. 9 shows an example of an evaluation pattern for evaluating a deflection shape of a beam shot written on a target object. In a writing apparatus, a plurality of evaluation patterns are respectively written at a plurality of positions arranged regularly in a deflection region deflected by a deflector in order to secure a writing position accuracy. FIG. 9 show the case where five by five (5×5) evaluation patterns are written in a subfield in two stage deflection, in such a way as to be arranged regularly, each evaluation pattern being composed of four quadrangular shot figures. The reason for a plurality of evaluation patterns being written is to evaluate change of the dimension and shape depending upon deflection positions. A shift amount of a deflection position in the deflection region is checked by measuring the position of each evaluation pattern, and a deflection region shape is also checked based on the shape of the figure which is formed by considering all the evaluation patterns as one figure.

However, with the miniaturization of patterns in recent years, reducing the deflection region is on the increase in order to perform writing at a more highly accurate writing position (refer to, e.g., Japanese Patent Application Laid-open (JP-A) No. 2011-228498). Therefore, it is becoming difficult to arrange many evaluation patterns in one deflection region such as shown in FIG. 9. For example, the deflection region has been reduced even to the size in which only about one-by-one (1×1) or two-by-two (2×2) evaluation patterns can be arranged in one deflection region. With such a number of evaluation patterns, it is difficult to specify a deflection shape of high precision.

BRIEF SUMMARY OF THE INVENTION

In accordance with one aspect of the present invention, an acquisition method of a charged particle beam deflection shape error includes writing a plurality of figure patterns, each being smaller than a deflection region of a plurality of deflection regions, with a charged particle beam, at a pitch different from an arrangement pitch of the plurality of deflection regions arranged to be deflected by a deflector that deflects the charged particle beam, synthesizing writing positions of the plurality of figure patterns into one virtual deflection region of a same size as the deflection region, based on a positional relationship between the deflection region including a position where a figure pattern concerned of the plurality of figure patterns has been written and the position where the figure pattern concerned has been written, calculating a shape error in a case of writing a pattern in the deflection region, using a synthesized writing position of each of the plurality of figure patterns, and outputting the shape error.

Further, in accordance with another aspect of the present invention, an acquisition method of a charged particle beam deflection shape error includes writing, with a charged particle beam, a plurality of first figure patterns each being smaller than a third deflection region, at a pitch different from an arrangement pitch of the third deflection region which is one of a first deflection region, a second deflection region, and the third deflection region, from larger to smaller, respectively deflected by a three stage deflector that deflects the charged particle beam, and writing a plurality of second figure patterns for evaluating position dependency in the second deflection region such that the plurality of second figure patterns are written at different positions in the second deflection region, calculating a position dependent error in the second deflection region by using writing positions of the plurality of second figure patterns that have been written, correcting a writing position of each of the plurality of first figure patterns that have been written, by using a position dependent error of the second deflection region close to the writing position of each of the plurality of the first figure patterns that have been written, synthesizing a corrected writing position of each of the plurality of first figure patterns into a virtual third deflection region of a same size as the third deflection region, based on a positional relationship between the third deflection region including a position where a first figure pattern concerned has been written and the position where the first figure pattern concerned has been written, calculating a shape error in a case of writing a pattern in the third deflection region by using a synthesized writing position of each of the plurality of first figure patterns and outputting the shape error.

Moreover, in accordance with an aspect of the present invention, a charged particle beam writing method includes correcting a writing position by using a shape error that is acquired by either one of the acquisition methods of a charged particle beam deflection shape error described above, and writing a pattern at a corrected writing position with a charged particle beam.

DETAILED DESCRIPTION OF THE INVENTION

In the Embodiments below, there will be described a method capable of acquiring a deflection region shape error and a method of writing with charged particle beams even when reduction of the deflection region is in progress.

Moreover, in the following Embodiments, there will be described a structure in which an electron beam is used as an example of a charged particle beam. However, the charged particle beam is not limited to the electron beam, and other charged particle beam, such as an ion beam, may also be used. Moreover, a variable-shaped electron beam writing apparatus will be described as an example of a charged particle beam apparatus.

Embodiment 1

Figure 1:
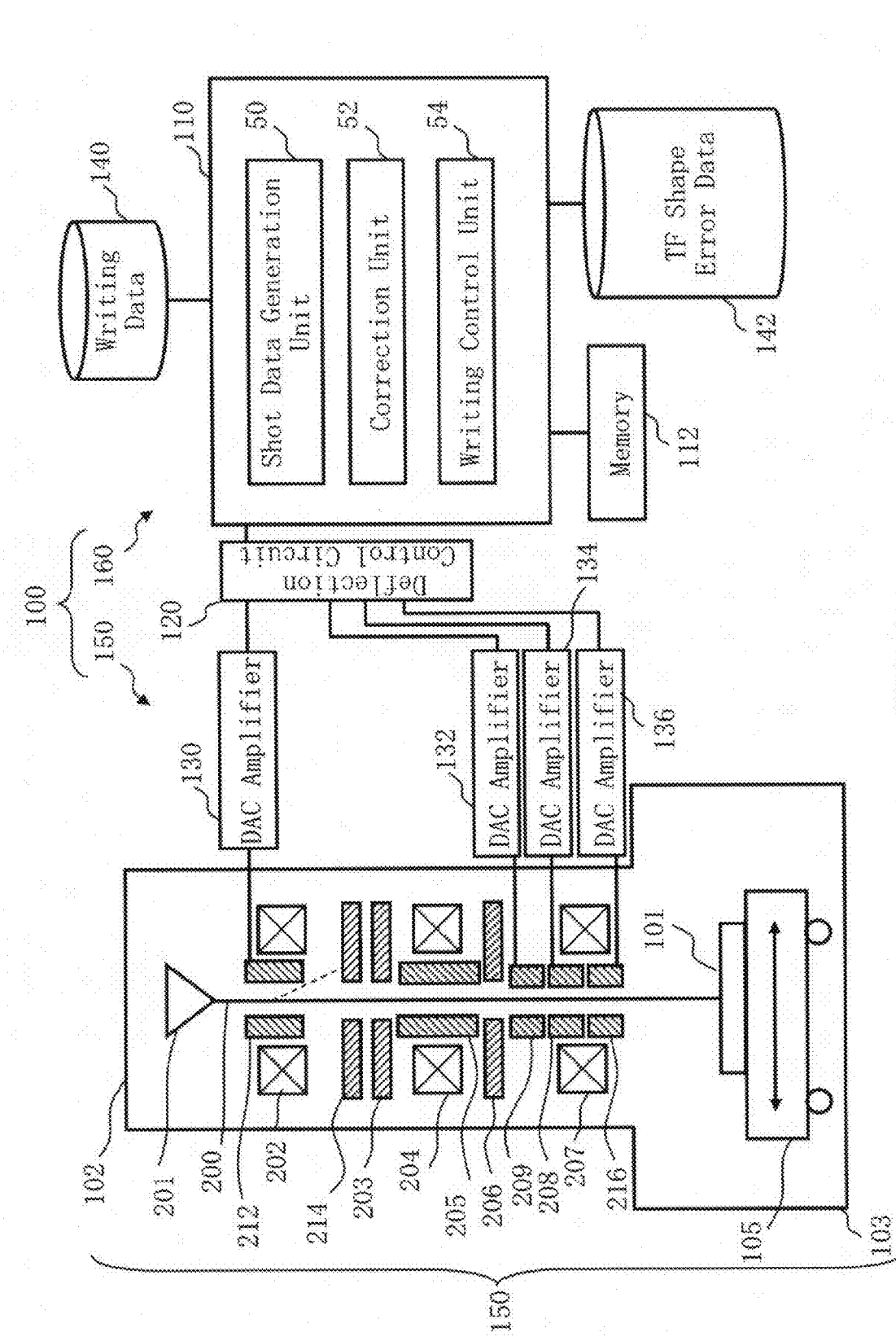
FIG. 1 is a schematic diagram showing a configuration of a writing apparatus according to Embodiment 1.

FIG. 1 is a schematic diagram showing a configuration of a writing apparatus according to Embodiment 1. In FIG. 1, a writing apparatus 100 includes a writing unit 150 and a control unit 160. The writing apparatus 100 is an example of a charged particle beam writing apparatus, and especially, is an example of a variable-shaped electron beam (VSB) writing apparatus. The writing unit 150 includes an electron lens barrel 102 and a writing chamber 103. In the electron lens barrel 102, there are arranged an electron gun assembly 201, an illumination lens 202, a blanking deflector (blanker) 212, a blanking aperture 214, a first shaping aperture 203, a projection lens 204, a deflector 205, a second shaping aperture 206, an objective lens 207, a main deflector 208, a sub deflector 209, and a sub-sub deflector 216. In the writing chamber 103, there is arranged an XY stage 105 that is movable at least in the x and y directions. On the XY stage 105, there is placed a target object 101 (substrate) serving as a writing target to which resist is applied. The target object 101 is, for example, a mask for exposure, a silicon wafer, etc. used for manufacturing semiconductor devices. The mask is, for example, a mask blank on which a pattern has not yet been formed.

The control unit 160 includes a control computer unit 110, a memory 112, a deflection control circuit 120, a DAC (digital analog converter) amplifier units 130, 132, 134, and 136 (deflection amplifiers), and storage devices 140 and 142, such as magnetic disk drives. The control computer unit 110, the memory 112, the deflection control circuit 120, and the storage devices 140 and 142 are mutually connected through a bus (not shown). To the deflection control circuit 120, there are connected the DAC amplifier units 130, 132, 134, and 136. The DAC amplifier unit 130 is connected to the blanking deflector 212. The DAC amplifier unit 132 is connected to the sub deflector 209. The DAC amplifier unit 134 is connected to the main deflector 208. The DAC amplifier unit 136 is connected to the sub-sub deflector 216.

Moreover, in the control calculator unit 110, there are arranged a shot data generation unit 50, a correction unit 52, and a writing control unit 54. Each function such as the shot data generation unit 50, the correction unit 52, and the writing control unit 54 may be configured by software such as a program implementing these functions or by hardware such as an electronic circuit. Alternatively, it may be configured by a combination of software and hardware. Input data necessary for the shot data generation unit 50, the correction unit 52, and the writing control unit 54, or a calculated result is stored in the memory 112 each time.

Writing data is input from the outside and stored in the storage device 140.

As described above, FIG. 1 shows a structure necessary for explaining Embodiment 1. In addition, other structure elements generally necessary for the writing apparatus 100 may also be included.

Figure 2:
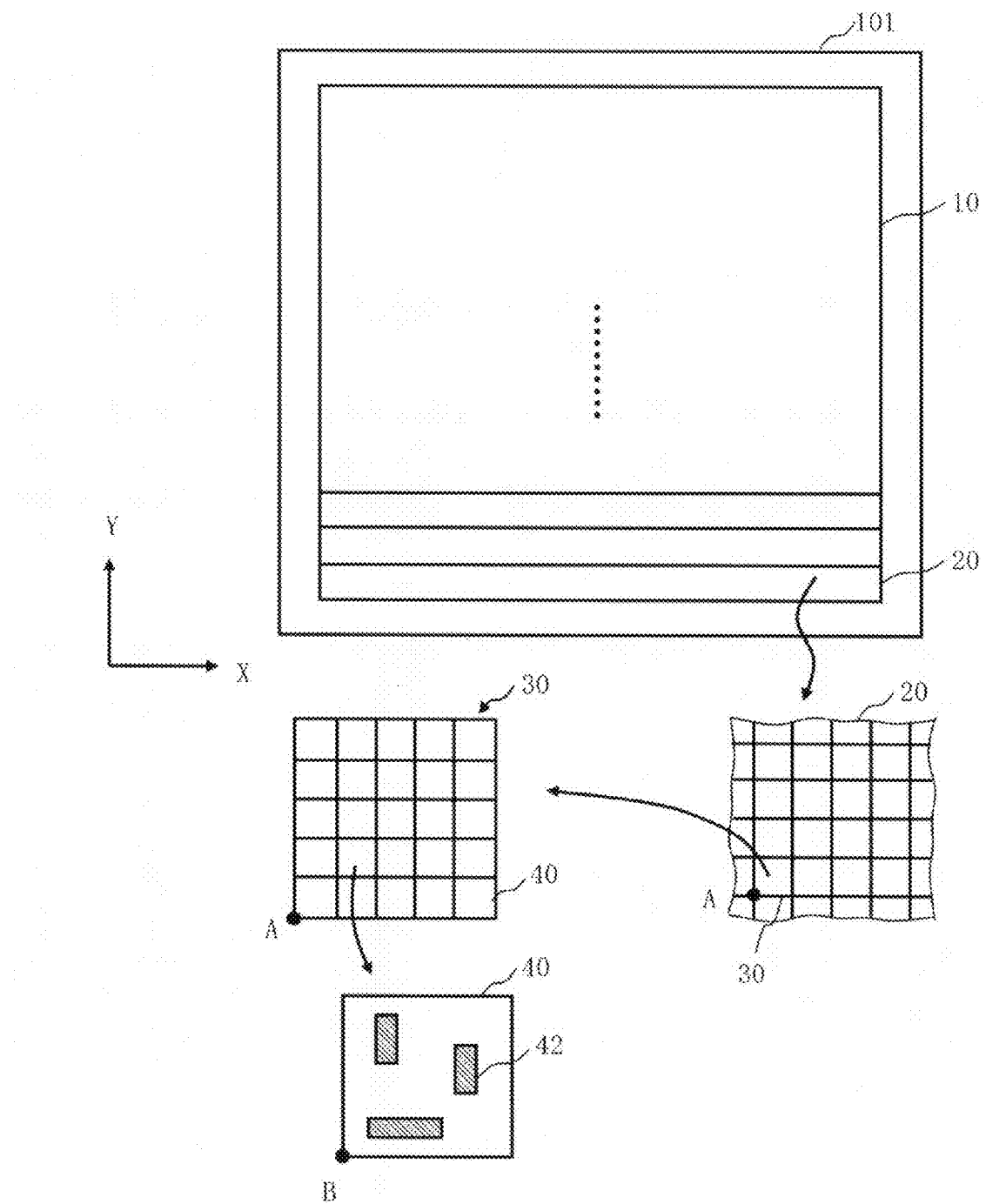
FIG. 2 is a schematic diagram explaining each region according to Embodiment 1.

FIG. 2 is a schematic diagram explaining each region according to Embodiment 1. In FIG. 2, a writing region 10 of the target object 101 is virtually divided into a plurality of strip-like stripe regions 20, which are aligned along the y direction, for example, by the width to be deflected by the main deflector 208 (the first deflector). Then, the stripe region 20 is divided by the width to be deflected by the main deflector 208 (the first deflector) into regions, which are aligned along the x direction and each of which serves as a deflection region (the first deflection region: the largest deflection region or main deflection region) of the main deflector 208 (the first deflector). This deflection region is virtually divided into a plurality of mesh-like subfields (SF) 30 (the second deflection region) by the size to be deflected by the sub deflector 209 (the second deflector). Then, each SF 30 is divided by the size to be deflected by the sub-sub deflector 216 (the third deflector) into a plurality of mesh-like under subfields 40 (the third deflection regions: an example of a small deflection region). The under subfield (USF) will be referred to as "TF" being an abbreviation of Tertiary Deflection Field that indicates the third deflection. A shot figure is written at each shot position 42 in each TF 40. Thus, each of the deflection regions deflected by the three-stage deflector which deflects the electron beam 200 are the main deflection region, the SF 30, and the TF 40 in order from larger to smaller in size of the region to be deflected.

A digital signal for blanking control is output from the deflection control circuit 120 to the DAC amplifier unit 130. The DAC amplifier unit 130 converts the digital signal to an analog signal and amplifies it to be applied as a deflection voltage to the blanking deflector 212. The electron beam 200 is deflected by the deflection voltage so as to form a beam shot.

A digital signal for controlling main deflection is output from the deflection control circuit 120 to the DAC amplifier unit 134. The DAC amplifier unit 134 converts the digital signal to an analog signal and amplifies it to be applied as a deflection voltage to the main deflector 208. The electron beam 200 is deflected by the deflection voltage, and thereby each beam shot is deflected to a reference position (for example, a center position or a lower left corner position of an SF concerned) of a predetermined subfield (SF) virtually divided to be mesh-like region. Moreover, in the case of performing writing while continuously moving the XY stage 105, the deflection voltage also includes a deflection voltage for tracking to follow the movement of the stage.

A digital signal for controlling sub deflection is output from the deflection control circuit 120 to the DAC amplifier unit 132. The DAC amplifier unit 132 converts the digital signal to an analog signal and amplifies it to be applied as a deflection voltage to the sub deflector 209. The electron beam 200 is deflected by the deflection voltage, and thereby each beam shot is deflected to a reference position (for example, a center position or a lower left corner position of a TF concerned) of a TF 40 being the smallest deflection region.

A digital signal for controlling sub-sub deflection is output from the deflection control circuit 120 to the DAC amplifier unit 136. The DAC amplifier unit 136 converts the digital signal to an analog signal and amplifies it to be applied as a deflection voltage to the sub-sub deflector 216. The electron beam 200 is deflected by the deflection voltage, and thereby each beam shot is deflected to each shot position in the TF 40.

The writing apparatus 100 performs writing processing in each stripe region 20 by using a multi-stage deflector. In this case, a three-stage deflector composed of the main deflector 208, the sub deflector 209 and the sub-sub deflector 216 is used as an example. While the XY stage 105 is continuously moving in the −x direction, for example, the first stripe region 20 is written in the x direction. After the first stripe region 20 has been written, the second stripe region 20 is written similarly or written in the opposite direction. Then, in the same way, the third and subsequent stripe regions 20 are written. The main deflector 208 (the first deflector) deflects the electron beam 200 in order to the reference position A of the SF 30 such that the movement of the XY stage 105 is followed. The sub deflector 209 (the second deflector) deflects the electron beam 200 in order from the reference position A of each SF 30 to the reference position B of the TF 40. Further, the sub-sub deflector 216 (the third deflector) deflects the electron beam 200 from the reference position B of each TF 40 to the beam shot position 42 in the TF 40 concerned. Thus, the sizes of the deflection regions of the main deflector 208, the sub deflector 209, and the sub-sub deflector 216 are different from each other. The TF 40 is the smallest deflection region in the deflection regions of this multi-stage deflector.

Here, the SF 30 is generated to be a 10 μm square, for example. On the other hand, the TF 40 is generated to be a 0.5 μm square, for example. An evaluation pattern for evaluating the shape of a deflected pattern needs to be formed in the size measurable with a pattern position measuring instrument. The pattern position measuring instrument can measure 0.2 μm or more, for example. Therefore, if the evaluation pattern is generated to be, for example, 0.35 μm square per shot, it means the situation in which only one evaluation pattern can be arranged in the TF 40 of 0.5 μm square. Alternatively, if writing is performed such that the reference position (for example, the lower left corner position) of an evaluation pattern is included, two by two (2×2) evaluation patterns can be written. However, as mentioned above, such a number of evaluation patterns is too small to specify a deflection shape of TF 40 of high accuracy to specify a position error at each position in TF 40. Then, in Embodiment 1, the following method, according to which a large number of evaluation patterns are not written in one TF 40, is performed to specify a deflection shape of TF 40.

Figure 3:
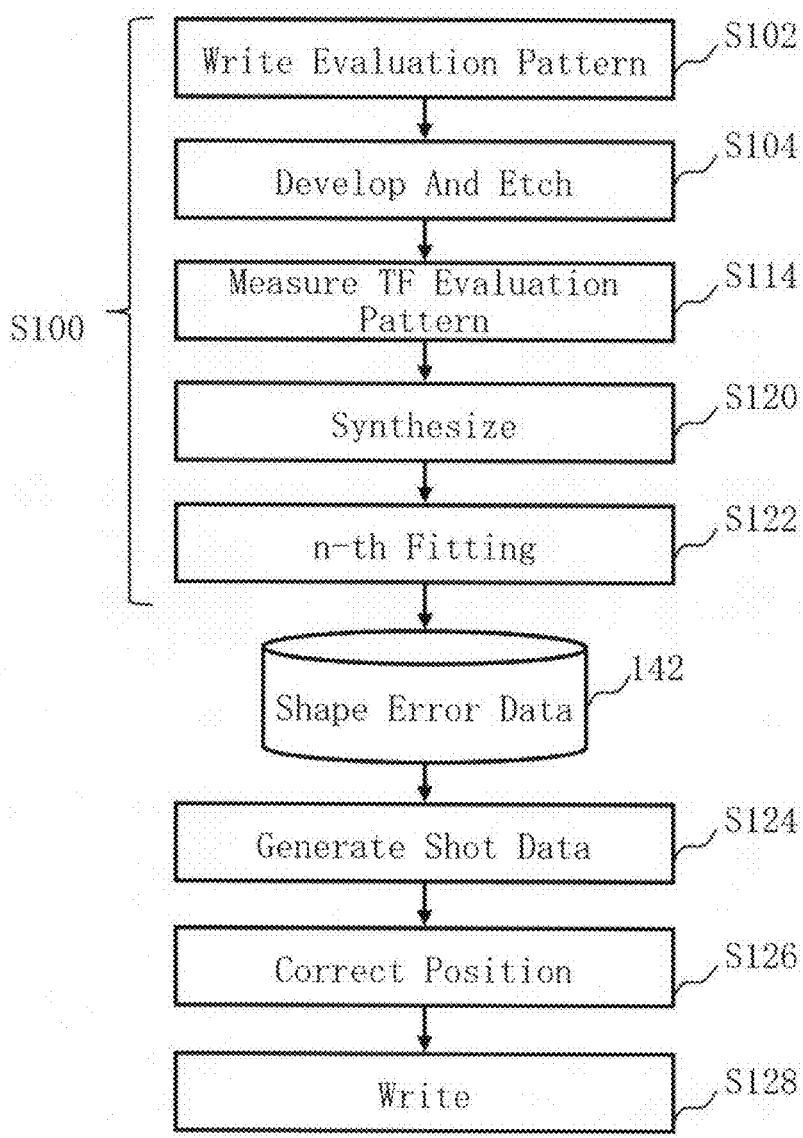
FIG. 3 is a flowchart showing main steps of a writing method according to Embodiment 1.

FIG. 3 is a flowchart showing main steps of a writing method according to Embodiment 1. In FIG. 3, the writing method according to Embodiment 1 executes a series of steps: a deflection shape error acquisition step (S100), a shot data generation step (S124), a position correction step (S126), and a writing step (S128). The deflection shape error acquisition step (S100), being a deflection shape error acquisition method, executes a series of steps as internal steps: an evaluation pattern writing step (S102), a developing and etching step (S104), a TF evaluation pattern measurement step (S114), a synthesis step (S120), and an n-th fitting step (S122).

In the evaluation pattern writing step (S102), an evaluation pattern is written on an evaluation substrate by the writing apparatus 100. As the evaluation substrate, for example, it is suitable to use a glass substrate on which a light-shielding film such as a chromium (Cr) film is formed and further a resist film is formed on the light-shielding film. In the evaluation pattern writing step (S102), a plurality of figure patterns each being smaller than a deflection region are written with electron beams by the writing apparatus 100 at a pitch different from the arrangement pitch of a plurality of deflection regions which are deflected by a deflector (for example, the sub-sub deflector 216) for deflecting electron beams. With respect to a deflection region concerning which a deflection shape error needs to be acquired, for example, when needing to acquire a deflection shape error of a deflection region (TF 40) deflected by the sub-sub deflector 216, a plurality of figure patterns each being smaller than the TF 40 are written with an electron beam, at a pitch different from the arrangement pitch of TF 40. For example, when needing to acquire a deflection shape error of a deflection region (SF 30) deflected by the sub deflector 209, a plurality of figure patterns each being smaller than the SF 30 are written with an electron beam, at a pitch different from the arrangement pitch of SF 30. For example, when needing to acquire a deflection shape error of a deflection region deflected by the main deflector 208, a plurality of figure patterns each being smaller than the deflection region to be deflected by the main deflector 208 are written with an electron beam, at a pitch different from the arrangement pitch of the deflection region to be deflected by the main deflector 208. Hereafter, there will be described as an example the case of needing to acquire a deflection shape error of a deflection region (TF 40) deflected by the sub-sub deflector 216.

Figure 4A:
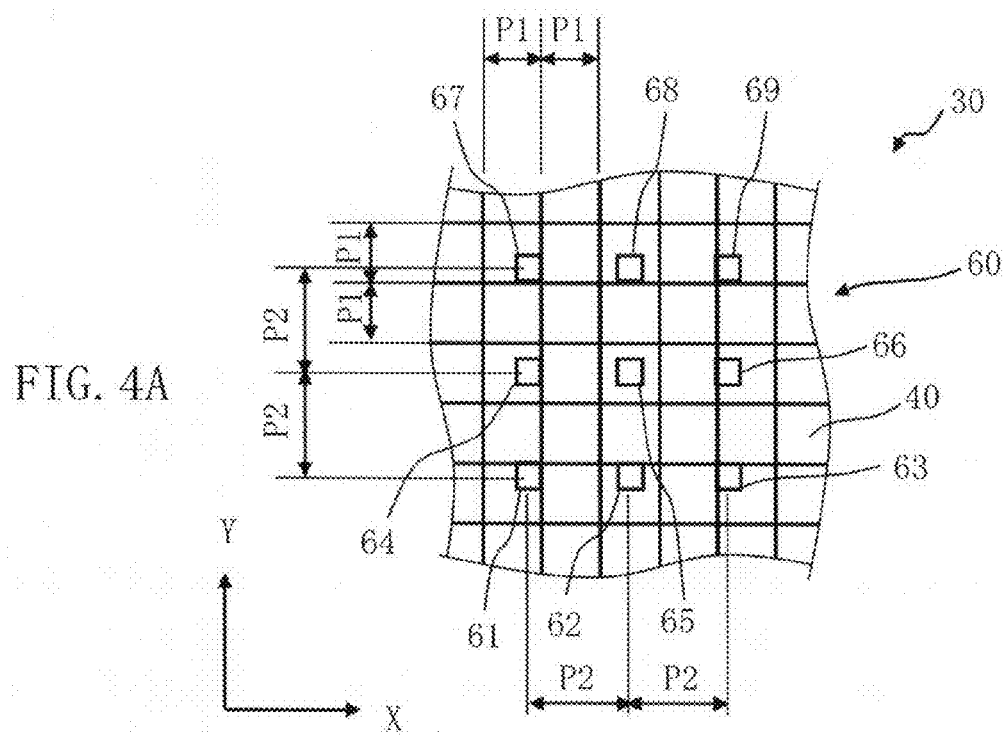
FIGS. 4A to 4C are schematic diagrams showing an example of a writing method of an evaluation pattern, an example of a measurement position, and an example of a deflection shape according to Embodiment 1.
Figure 4B:
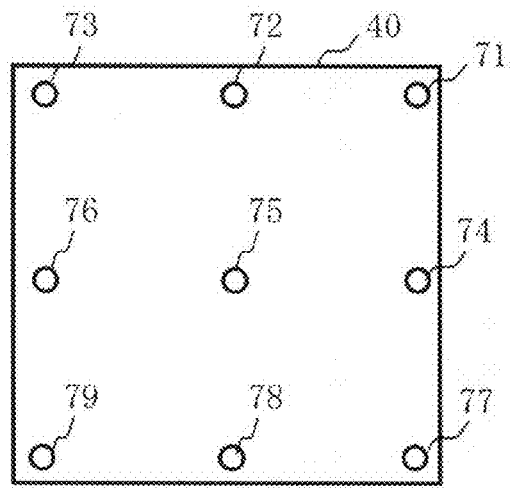
Figure 4C:
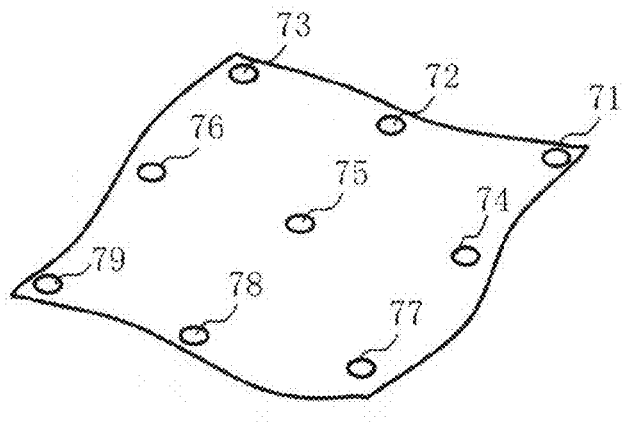

FIGS. 4A to 4C are schematic diagrams showing an example of a writing method of an evaluation pattern, an example of a measurement position, and an example of a deflection shape according to Embodiment 1. As shown in FIG. 4A, a plurality of figure patterns 60 (evaluation patterns: the first figure patterns) for evaluating TF, each being smaller than a TF 40, are written with the electron beam 200, at a pitch P2 different from the dimension (arrangement pitch) P1 in the x and y directions of TF 40 (deflection region, an example of the third deflection region). In the example of FIG. 4A, a plurality of figure patterns 60 include rectangular figure patterns 61 to 69, for example. For example, they are written at the pitch P2 which is not an integral multiple of the arrangement pitch P1 of the TF 40. It is preferable for the arrangement pitch P2 of the figure pattern 60 to be larger than the arrangement pitch P1 of TF 40. Further, it is preferable that the arrangement pitch P2 of the figure pattern 60 is set to be larger in size than the arrangement pitch P1 of TF 40 and smaller than an integral multiple (for example, twice) of the arrangement pitch P1 of TF 40, for example.

In the example of FIG. 4A, a plurality of figure patterns 61 to 69 are respectively written in a corresponding one of a plurality of grid-like TFs 40 in a partial region in a certain SF 30. For example, the figure pattern 61 is written at the position in the upper part along the y direction and the right end part along the x direction in a TF 40, the figure pattern 62 is written at the position in the upper part along the y direction and the center part along the x direction in a TF 40, and the figure pattern 63 is written at the position in the upper part along the y direction and the left end part along the x direction in a TF 40. Further, the figure pattern 64 is written at the position in the center part along the y direction and the right end part along the x direction in a TF 40, the figure pattern 65 is written at the position in the center part along the y direction and the center part along the x direction in a TF 40, and the figure pattern 66 is written at the position in the center part along the y direction and the left end part along the x direction in a TF 40. Furthermore, the figure pattern 67 is written at the position in the lower part along the y direction and the right end part along the x direction in a TF 40, the figure pattern 68 is written at the position in the lower part along the y direction and the center part along the x direction in a TF 40, and the figure pattern 69 is written at the position in the lower part along the y direction and the left end part along the x direction in a TF 40. Thereby, the figure patterns 61 to 69 having different writing positions with respect to TF 40 can be respectively written in a corresponding one of a plurality of TFs 40, for example.

In the developing and etching step (S104), the evaluation substrate, on which a plurality of figure patterns 60 are written, is developed to form a resist pattern. Then, an exposed light-shielding film is etched by using the resist pattern as a mask. Then, the resist pattern is removed by means of ashing, etc. (not shown) so as to form a light-shielding film pattern on the evaluation substrate. By this method, a light-shielding film pattern, whose writing position with respect to TF 40 is different from each other, can be formed in each of a plurality of TFs 40, for example.

In the TF evaluation pattern measurement step (S114), the position of each light-shielding film pattern (figure pattern) formed on the evaluation substrate is measured with a pattern position measuring instrument.

In the synthesis step (S120), based on a positional relationship between the TF 40 including the position where a figure pattern concerned has been written and the position where the figure pattern concerned has been written, the writing positions of a plurality of figure patterns (the first figure patterns) are synthesized in one TF 40 being a virtual deflection region having the same size as the TF 40. Since measurement results of a plurality of figure patterns with respect to each position in the TF 40 have been obtained, it is possible to acquire a relative position of each position from the reference position of TF 40. Specifically, as shown in FIG. 4B, the figure pattern 61 (light-shielding film pattern) is synthesized at a position 71 in the upper part along the y direction and the right end part along the x direction in a TF 40. The figure pattern 62 (light-shielding film pattern) is synthesized at a position 72 in the upper part along the y direction and the center part along the x direction in the TF 40. The figure pattern 63 (light-shielding film pattern) is synthesized at a position 73 in the upper part along the y direction and the left end part along the x direction in the TF 40. The figure pattern 64 (light-shielding film pattern) is synthesized at a position 74 in the center part along the y direction and the right end part along the x direction in the TF 40. The figure pattern 65 (light-shielding film pattern) is synthesized at a position 75 in the center part along the y direction and the center part along the x direction in the TF 40. The figure pattern 66 (light-shielding film pattern) is synthesized at a position 76 in the center part along the y direction and the left end part along the x direction in the TF 40. The figure pattern 67 (light-shielding film pattern) is synthesized at a position 77 in the lower part along the y direction and the right end part along the x direction in the TF 40. The figure pattern 68 (light-shielding film pattern) is synthesized at a position 78 in the lower part along the y direction and the center part along the x direction in the TF 40. The figure pattern 69 (light-shielding film pattern) is synthesized at a position 79 in the lower part along the y direction and the left end part along the x direction in the TF 40. If there is no relative position error (deflection region shape error) between each figure pattern and the TF 40 having been used for synthesizing, they are arranged regularly to be three by three (3×3) in the horizontal and vertical directions as shown in FIG. 4B. However, if each figure pattern is written in a shifted manner, its position is also shifted. Therefore, as shown in FIG. 4C, each of the positions 71 to 79 having been synthesized is also shifted. The deflection region shape of TF 40, which is ideally a square, becomes a distorted shape as shown in FIG. 4C.

In the n-th fitting step (S122), a deflection region shape error of TF 40 is calculated by approximating each shift amount (or "deviation amount") of the writing positions 71 to 79 of a plurality of figure patterns that have been written, by a polynomial. For example, it is preferable to perform approximation by the third-order polynomial respectively with respect to the x and y directions. In other words, each coefficient of the polynomial is obtained by approximation. The shift amount ($\Delta x'$, $\Delta y'$) resulting from the deflection shape error of TF 40 on the design coordinates (x, y) can be approximated by the following equations (1) and (2), for example.

$$\Delta x' = a_0 + a_1 x + a_2 y + a_3 x^2 + a_4 xy + a_5 y^2 + a_6 x^3 + a_7 x^2 y + a_8 xy^2 + a_9 y^3 \quad (1)$$

$$\Delta y' = b_0 + b_1 x + b_2 y + b_3 x^2 + b_4 xy + b_5 y^2 + b_6 x^3 + b_7 x^2 y + b_8 xy^2 + b_9 y^3 \quad (2)$$

As described above, a shape error in the case of writing a pattern in a small deflection region is calculated by using the writing position of each synthesized figure pattern. Then, a polynomial or a coefficient of the polynomial which indicates an obtained deflection region shape error of TF 40 is output as TF shape error data. The output TF shape error data is input into the writing apparatus 100 and stored in the storage device 142.

Thus, according to Embodiment 1, a deflection region shape error of TF 40 can be acquired by using the method described above even when reduction of a deflection region is on the increase. In the cases of FIGS. 4A to 4C, data is acquired one by one concerning each position of TF 40 in a partial region (for example, a region in which five by five TFs 40 can be arranged) of a certain SF 30. However, the acquisition method of a deflection region shape error of TF 40 is not limited to the method described above. For example, it is also preferable to further increase the accuracy by acquiring a plurality of data concerning each position of TF 40.

Figure 5A:
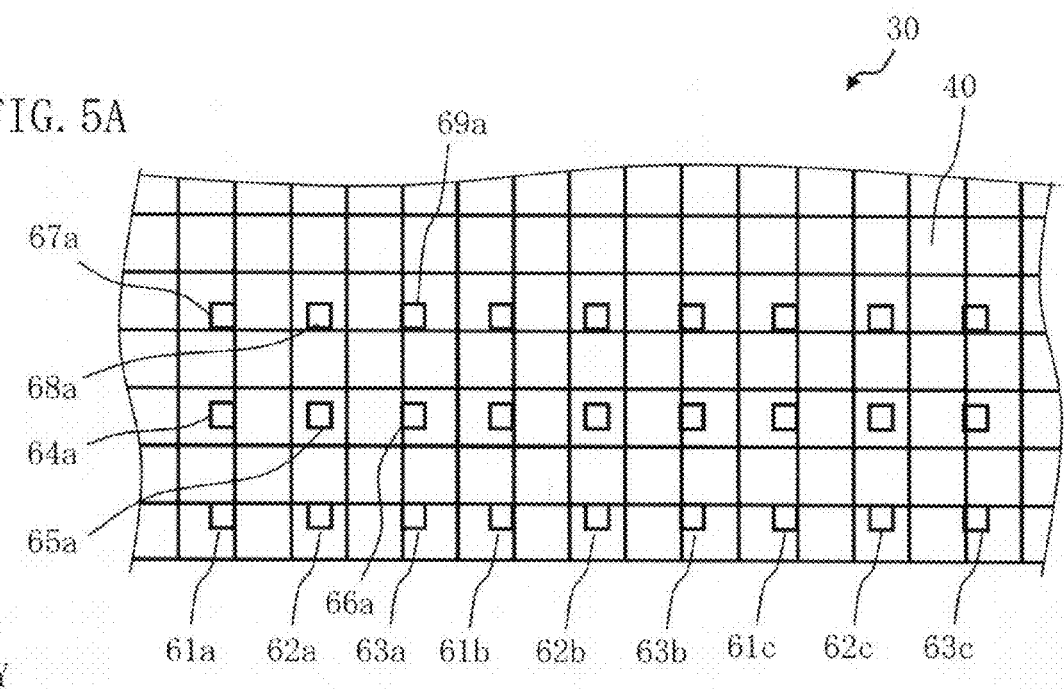
FIGS. 5A to 5C are schematic diagrams showing another example of a writing method of an evaluation pattern, an example of a measurement position, and an example of a deflection shape according to Embodiment 1.
Figure 5B:
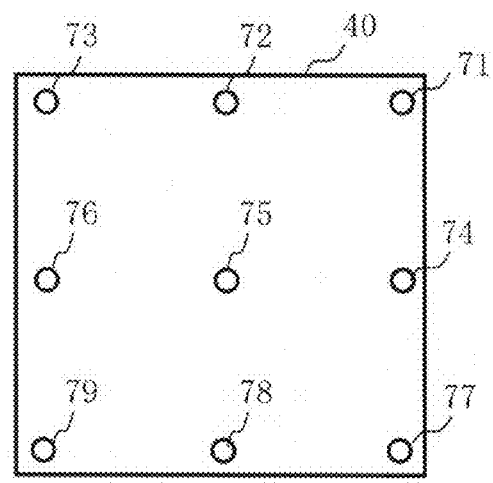
Figure 5C:
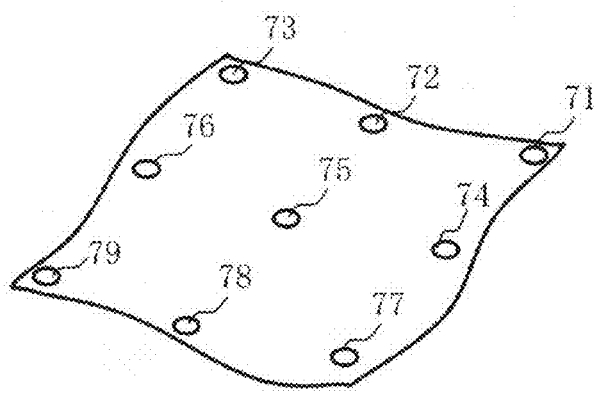

FIGS. 5A to 5C are schematic diagrams showing another example of a writing method of an evaluation pattern, an example of a measurement position, and an example of a deflection shape according to Embodiment 1. As shown in FIG. 5A, a plurality of figure patterns 60 (evaluation patterns: the first figure patterns) for evaluating TF, each being smaller than a TF 40, are written with the electron beam 200, at a pitch P2 different from the arrangement pitch P1 in the x and y directions of TF 40 (small deflection region). In the example of FIG. 5A, similarly to FIGS. 4A to 4C, a plurality of figure patterns 60 include the figure patterns 61 to 69. For example, they are written at the pitch P2 which is not an integral multiple of the arrangement pitch P1 of the TF 40. It is preferable for the arrangement pitch P2 of the figure pattern 60 to be larger than the arrangement pitch P1 of TF 40. Further, it is preferable that the arrangement pitch P2 of the figure pattern 60 is set to be larger in size than the arrangement pitch P1 of TF 40 and smaller than an integral multiple (for example, twice) of the arrangement pitch P1 of TF 40, for example.

In the example of FIG. 5A, a plurality of figure patterns 61 to 69 are respectively written in a corresponding one of a plurality of grid-like TFs 40 in a region, which is larger than the region shown in FIG. 4A, in a certain SF 30. For example, the figure pattern 61 is written at the position in the upper part along the y direction and the right end part along the x direction in a TF 40, the figure pattern 62 is written at the position in the upper part along the y direction and the center part along the x direction in a TF 40, and the figure pattern 63 is written at the position in the upper part along the y direction and the left end part along the x direction in a TF 40. These three figure patterns 61 to 63 are repeatedly written in the x direction at the same pitch. It is preferable that when writing repeatedly, the position along the y direction remains at the same position without changing. Thereby, the figure patterns 61a to 63a, 61b to 63b, and 61c to 63c are arranged.

Similarly, the figure pattern 64 is written at the position in the center part along the y direction and the right end part along the x direction in a TF 40, the figure pattern 65 is written at the position in the center part along the y direction and the center part along the x direction in a TF 40, and the figure pattern 66 is written at the position in the center part along the y direction and the left end part along the x direction in a TF 40. These three figure patterns 64 to 66 are repeatedly written in the x direction at the same pitch. It is preferable that when writing repeatedly, the position along the y direction remains at the same position without changing. Thereby, the figure patterns 64a to 66a, 64b to 64b (not shown), and 64c to 66c (not shown) are arranged.

Similarly, the figure pattern 67 is written at the position in the lower part along the y direction and the right end part along the x direction in a TF 40, the figure pattern 68 is written at the position in the lower part along the y direction and the center part along the x direction in a TF 40, and the figure pattern 69 is written at the position in the lower part along the y direction and the left end part along the x direction in a TF 40. These three figure patterns 67 to 69 are repeatedly written in the x direction at the same pitch. It is preferable that when writing repeatedly, the position along the y direction remains at the same position without changing. Thereby, the figure patterns 67a to 69a, 67b to 69b (not shown), and 67c to 69c (not shown) are arranged.

By the method described above, figure patterns from 61 (composed of three figure patterns 61a to 61c) to 69 (composed of three figure patterns 69a to 69c), whose writing positions with respect to TF 40 are different from each other, can be respectively written in a corresponding one of a plurality of TFs 40, for example. In the case of FIG. 5A, writing is repeated three times to obtain three same figure patterns, but the number of times is not limited to three, and it may be a larger number of times.

In the developing and etching step (S104), the evaluation substrate, on which a plurality of figure patterns 60 are written, is developed to form a resist pattern. Then, an exposed light-shielding film is etched by using the resist pattern as a mask. Then, the resist pattern is removed by means of ashing, etc. (not shown) so as to form a light-shielding film pattern on the evaluation substrate. By this method, three light-shielding film patterns each, whose three writing positions with respect to TF 40 are different from each other, can be respectively formed in a corresponding one of a plurality of TFs 40, for example.

In the TF evaluation pattern measurement step (S114), each position of the figure patterns (light-shielding film patterns) 61 to 69 formed on the evaluation substrate is measured with a pattern position measuring instrument.

In the synthesis step (S120), based on a positional relationship between the TF 40 including the position where a figure pattern concerned has been written and the position where the figure pattern concerned has been written, the writing positions of a plurality of figure patterns (the first figure patterns) are synthesized in one TF 40. Since measurement results of a plurality of figure patterns with respect to each position in the TF 40 have been obtained, it is possible to acquire a relative position of each position from the reference position of TF 40. When synthesizing, an error can be averaged by using an average value. Specifically, as shown in FIG. 5B, the average value (average position) of the positions of the figure patterns 61a to 61c (light-shielding film patterns) is synthesized at the position 71 in the upper part along the y direction and the right end part along the x direction in a TF 40. The average value (average position) of the positions of the figure patterns 62a to 62c (light-shielding film patterns) is synthesized at the position 72 in the upper part along the y direction and the center part along the x direction in the TF 40. The average value (average position) of the positions of the figure patterns 63a to 63c (light-shielding film patterns) is synthesized at the position 73 in the upper part along the y direction and the left end part along the x direction in the TF 40. The average value (average position) of the positions of the figure patterns 64a to 64c (light-shielding film patterns) is synthesized at the position 74 in the center part along the y direction and the right end part along the x direction in the TF 40. The average value (average position) of the positions of the figure patterns 65a to 65c (light-shielding film patterns) is synthesized at the position 75 in the center part along the y direction and the center part along the x direction in the TF 40. The average value (average position) of the positions of the figure patterns 66a to 66c (light-shielding film patterns) is synthesized at the position 76 in the center part along the y direction and the left end part along the x direction in the TF 40. The average value (average position) of the positions of the figure patterns 67a to 67c (light-shielding film patterns) is synthesized at the position 77 in the lower part along the y direction and the right end part along the x direction in the TF 40. The average value (average position) of the positions of the figure patterns 68a to 68c (light-shielding film patterns) is synthesized at the position 78 in the lower part along the y direction and the center part along the x direction in the TF 40. The average value (average position) of the positions of the figure patterns 69a to 69c (light-shielding film patterns) is synthesized at the position 79 in the lower part along the y direction and the left end part along the x direction in the TF 40. If there is no deflection region shape error, they are arranged regularly to be three by three (3×3) in the horizontal and vertical directions as shown in FIG. 5B. However, if each figure pattern is written in a shifted manner, its position is also shifted. Therefore, as shown in FIG. 5C, each of the positions 71 to 79 having been synthesized is shifted. The deflection region shape of TF 40, which is ideally a square, becomes a distorted shape as shown in FIG. 5C. In the examples of FIG. 5A to FIG. 5C, the accuracy with respect to a deflection region shape error of TF 40 can be further increased by using the average value of a plurality of data.

The writing apparatus 100 irradiates a corrected position in a TF with a beam shot by using deflection region shape error data (TF shape error data) of TF 40 obtained by the method described above. Specifically, it operates as follows:

In the shot data generation step (S124), the shot data generation unit 50 inputs writing data from the storage device 140, performs data conversion processing of an a plurality of steps, divides each figure pattern being a writing target into shot figures each having the size to be irradiated by a one-time shot, and generates shot data of a writing apparatus specific format. A figure code indicating a figure type of each shot figure, a figure size, a writing position, etc., for example, are defined as shot data for each shot.

In the position correction step (S126), the correction unit 52 corrects a writing position by using a deflection shape error acquired by the above stated method of acquiring a deflection shape error. Specifically, the correction unit 52 reads TF shape error data from the storage device 142, and, for each shot, corrects for a design writing position in a TF 40 based on the TF shape error. For example, a shift amount ($\Delta x'$, $\Delta y'$) is calculated by substituting design writing position coordinates (x, y) in a TF 40 into a polynomial obtained in the n-th fitting step (S122). Then, for example, a position (x−$\Delta x'$, y−$\Delta y'$) obtained by subtracting a shift amount ($\Delta x$, $\Delta y'$) from design writing position coordinates (x, y) can be a writing position after the correction.

In the writing step (S128), the writing control unit 54 outputs, for each shot, a corrected writing position to the deflection control circuit 120. Then, the deflection control circuit 120 calculates a deflection amount for performing writing at the corrected position. The deflection amount after the correction is output to the DAC amplifier 136 for the sub-sub deflector 216 which performs deflection to the relative position in TF 40. In addition, the deflection control circuit 120 outputs deflection data corresponding to an irradiation time for a required dose to the DAC amplifier 130 for the blanking deflector 212. Similarly, the deflection control circuit 120 outputs the deflection data to the DAC amplifier 134 for the main deflector 208, and the DAC amplifier 132 for the sub deflector 209 for deflection to the relative position in SF 30.

Moreover, the writing control unit 54 controls the writing unit 150 to start writing processing. The writing unit 150 writes a pattern on the corrected writing position with a charged particle beam. Specifically, it operates as described below. The DAC amplifier unit 130 converts the digital signal from the deflection control circuit 120 to an analog signal and amplifies it to be applied as a deflection voltage to the blanking deflector 212. The DAC amplifier unit 132 converts the digital signal from the deflection control circuit 120 to an analog signal and amplifies it to be applied as a deflection voltage to the sub deflector 209. The DAC amplifier unit 134 converts the digital signal from the deflection control circuit 120 to an analog signal and amplifies it to be applied as a deflection voltage to the main deflector 208. The DAC amplifier unit 136 converts the digital signal from the deflection control circuit 120 to an analog signal and amplifies it to be applied as a deflection voltage to the sub-sub deflector 216.

The electron beam 200 emitted from the electron gun assembly 201 (emission unit), when passing through the blanking deflector 212, is controlled to pass through the blanking aperture 214 by the blanking deflector 212 in the case where the beam is in the ON state, and is deflected by the blanking deflector 212 so that the entire beam may be blocked by the blanking aperture 214 in the case where the beam is in the OFF state. The electron beam 200, passing through the blanking aperture 214 while changing the state from the beam OFF to the beam ON and lastly again to the beam OFF, serves as one shot of the electron beam. The blanking deflector 212 controls the direction of the passing electron beam 200 to alternately generate the beam ON state and the beam OFF state. For example, it is acceptable to apply a voltage to the blanking deflector 212 when in the beam OFF state and not to apply a voltage when in the beam ON state. The dose per shot of the electron beam 200 to irradiate the target object 101 is adjusted depending upon an irradiation time of each shot.

As described above, each shot of the electron beam 200, which is generated by passing through the blanking deflector 212 and the blanking aperture 214, irradiates the whole of the first shaping aperture 203 having a quadrangular opening by the illumination lens 202. Here, the electron beam 200 is first shaped to be a quadrangle. Then, after having passed through the first shaping aperture 203, the electron beam 200 of the first aperture image is projected onto the second shaping aperture 206 by the projection lens 204. The first aperture image on the second shaping aperture 206 is deflection-controlled by the deflector 205 so as to change (variably shape) the shape and size of the beam. Such variable beam shaping is performed for each shot, and, usually, each shot is shaped to have a different shape and size. Then, after having passed through the second shaping aperture 206, the electron beam 200 of the second aperture image is focused by the objective lens 207, and deflected by the main deflector 208, the sub deflector 209, and the sub-sub deflector 216 to reach to irradiate a desired position on the target object 101 placed on the XY stage 105 which moves continuously. As described above, a plurality of shots of the electron beam 200 are deflected in order by each deflector onto the target object 101 serving as a substrate.

As described above, according to Embodiment 1, it is possible to apply each beam shot to the position where a deflection region shape error of TF 40 has been corrected. Therefore, a pattern can be written at a more precise position.

Although a deflection region shape error of TF 40 is obtained in the example described above, it is also preferable to obtain a deflection region shape error of SF 30 by the same method. That is, a plurality of figure patterns 60 (evaluation patterns: the first figure patterns) for evaluating SF, each being smaller than SF 30, are written with the electron beam 200, at a pitch P2 different from the arrangement pitch P1 in the x and y directions of SF 30 (another example of the small deflection region). What is necessary is just to read TF 40 as SF 30 in the example of FIG. 4A. A plurality of figure patterns 60 include figure patterns 61 to 69. For example, they are written at a pitch P2 which is not an integral multiple of the arrangement pitch P1 of the SF 30. It is preferable for the arrangement pitch P2 of the figure pattern 60 to be larger than the arrangement pitch P1 of SF 30. Further, it is preferable that the arrangement pitch P2 of the figure pattern 60 is set to be larger in size than the arrangement pitch P1 of SF 30 and smaller than an integral multiple (for example, twice) of the arrangement pitch P1 of SF 30, for example. Thus, it is also preferable to apply the method described above to SF 30 which is the second largest after the largest deflection region (the main deflection region). According to Embodiment 1, the method described above is applied, when acquiring a deflection shape error of TF 40 for the third stage of three-stage deflection, to the writing apparatus 100 that deflects the electron beam 200 by three-stage deflection, and also, this method may be applied to the stripe 20 for the first stage or the SF 30 for the second stage of the three stage deflection. Alternatively, the method described above may be applied to the stripe 20 for the first stage or the SF 30 for the second stage of a writing apparatus employing two stage (main and sub) deflection. Further, the method described above may be applied to a writing apparatus employing single stage deflection of one main stage. Thus, regardless of the reduction of a deflection region, the method described above is preferably used for acquiring a deflection region shape error.

Embodiment 2

In Embodiment 1, in the case of FIG. 4A, the position of an evaluation pattern is acquired one by one with respect to the main positions, for example, nine (3×3) positions, of TF 40. According to this method, although a correction residual remains due to a small number of parameters since the number of data concerning each position is one, there is a merit that the influence of a position dependent error in SF 30 can be made small by using a region close to the optical axis in SF 30, for example. On the other hand, in the case of FIG. 5A, a plurality of (for example, three each) positions of evaluation patterns are acquired with respect to each of the main positions, for example, nine (3×3) positions, of TF 40. Although this method has a merit that a correction residual can be made small since the number of parameters increases by using the average of a plurality of data concerning each position, it has a demerit that there is a possibility of receiving an influence of a position dependent error in SF 30 because of using a wide range region in SF 30, for example. Then, according to Embodiment 2, there will be described a configuration in which while acquiring a plurality of (for example, three each) positions of evaluation patterns with respect to each of the main positions, for example, nine (3×3) positions of TF 40, the position dependent error in SF 30 is also corrected.

The configuration of the writing apparatus according to Embodiment 2 is the same as that of FIG. 1. Hereafter, the content of Embodiment 2 is the same as that of Embodiment 1 except for what is particularly described below.

Figure 6:
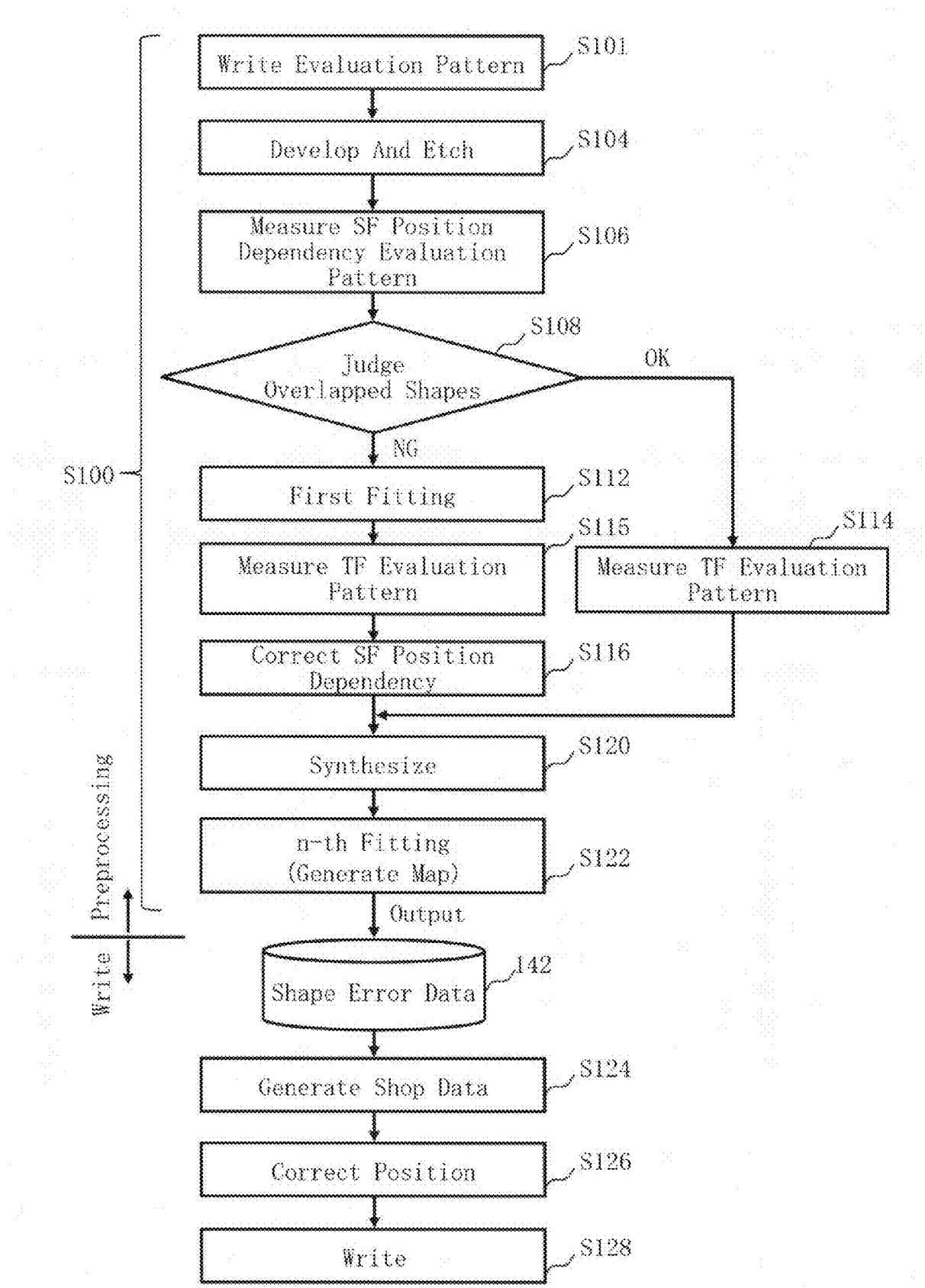
FIG. 6 is a flowchart showing main steps of a writing method according to Embodiment 2.

FIG. 6 is a flowchart showing main steps of a writing method according to Embodiment 2. FIG. 6 is the same as FIG. 3 in that a series of steps: the deflection shape error acquisition step (S100), the shot data generation step (S124), the position correction step (S126), and the writing step (S128) are executed. However, the deflection shape error acquisition step (S100), being a deflection shape error acquisition method, executes a series of steps as internal steps: an evaluation pattern writing step (S101), the developing and etching step (S104), an SF position dependency evaluation pattern measurement step (S106), a judgment step (S108), a first fitting step (S112), a TF evaluation pattern measurement step (S114), a TF evaluation pattern measurement step (S115), an SF position dependency correction step (S116), a synthesis step (S120), and an n-th fitting step (S122).

In the evaluation pattern writing step (S101), an evaluation pattern is written on the evaluation substrate by the writing apparatus 100. The evaluation substrate is the same as that of Embodiment 1.

Figure 7A:
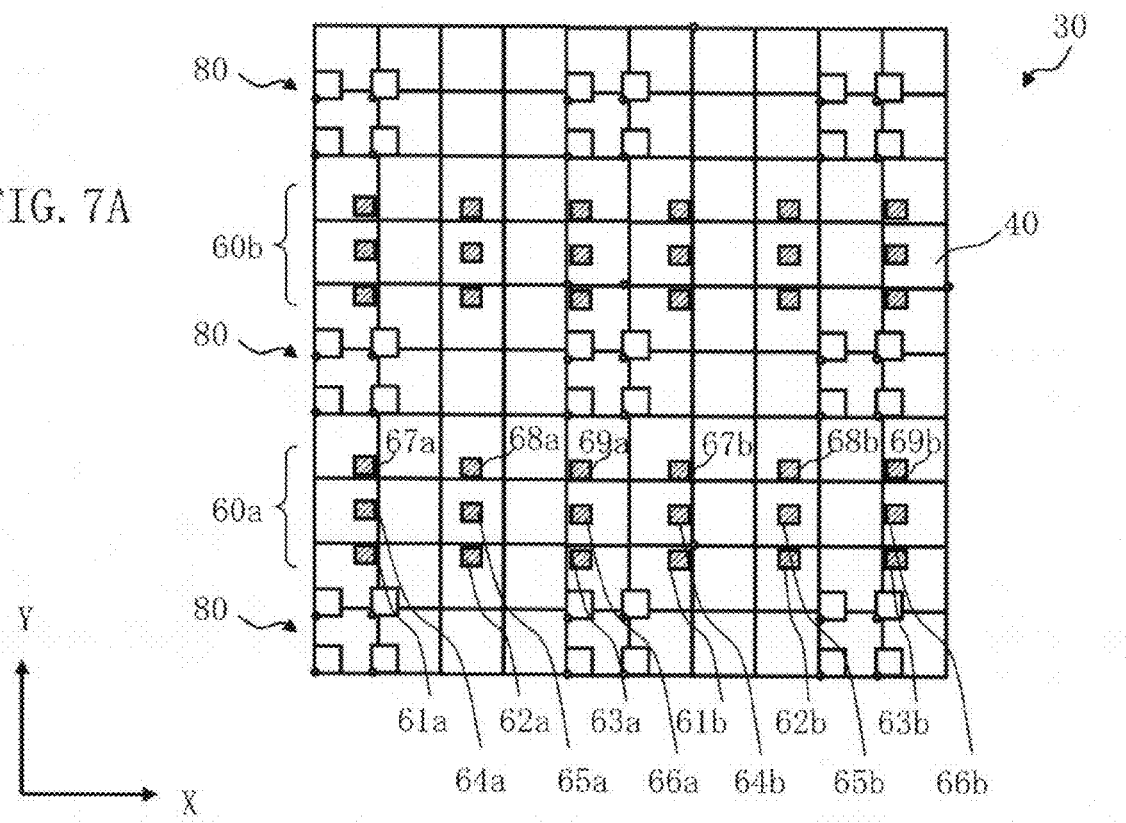
FIGS. 7A to 7C are schematic diagram showing an example of a writing method of an evaluation pattern, an example of a measurement position, and an example of a deflection shape according to Embodiment 2.
Figure 7B:
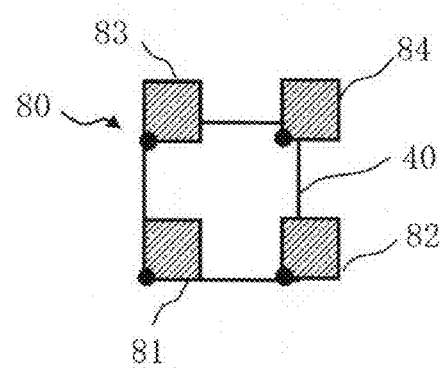
Figure 7C:
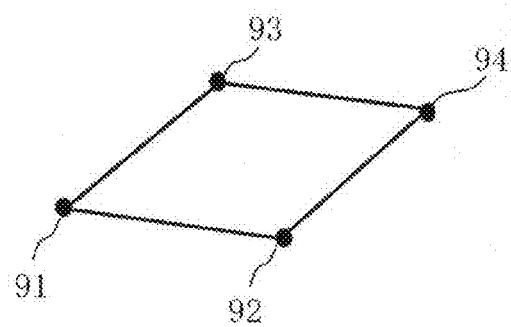
Figure 8:
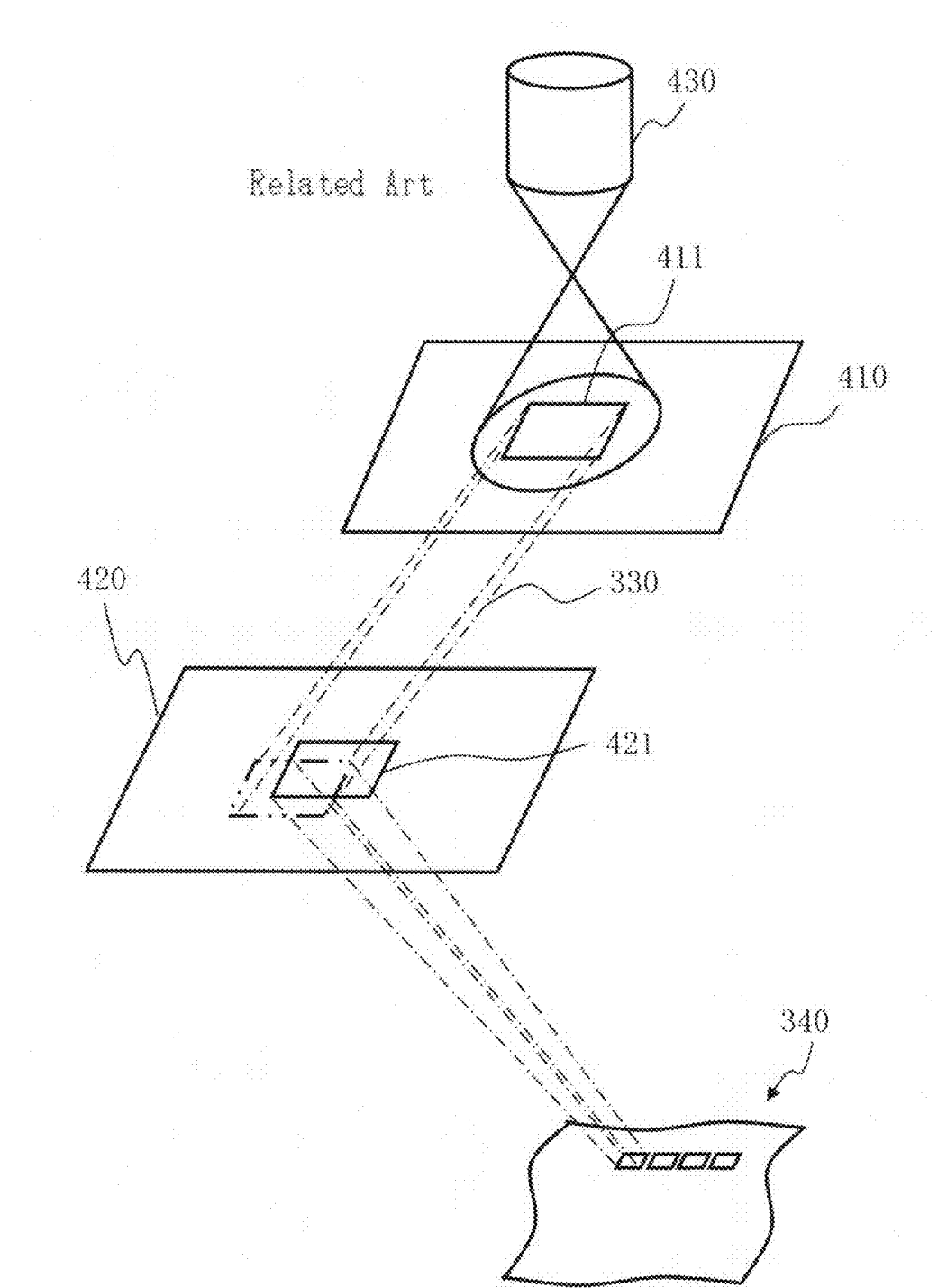
FIG. 8 is a schematic diagram explaining operations of a variable shaped electron beam writing apparatus.
Figure 9:
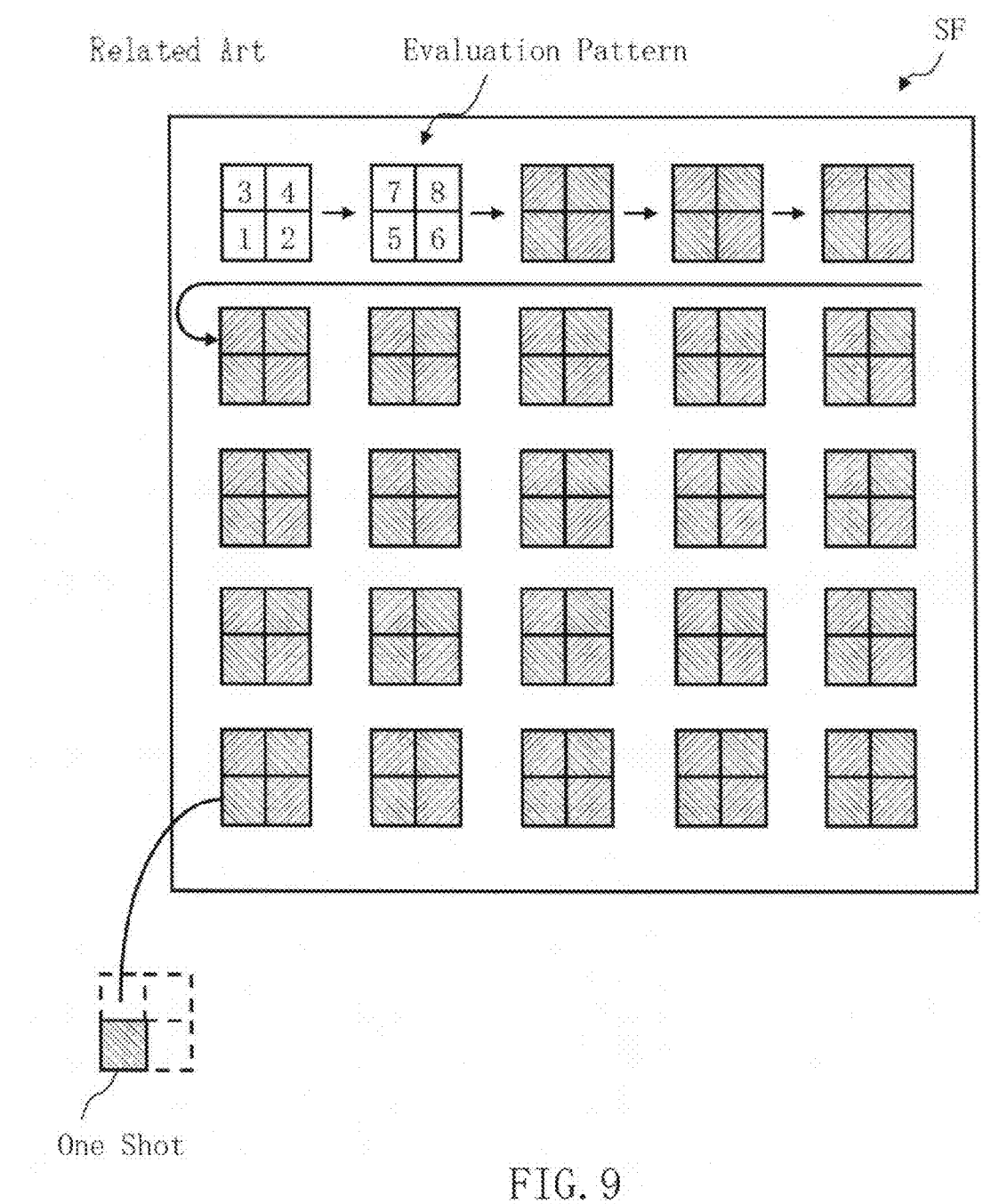
FIG. 9 shows an example of an evaluation pattern for evaluating a deflection shape.

FIGS. 7A to 7C are schematic diagram showing an example of a writing method of an evaluation pattern, an example of a measurement position, and an example of a deflection shape according to Embodiment 2. FIG. 7 is the same as FIG. 5 in that a plurality of figure patterns 60 (evaluation patterns: the first figure patterns) for evaluating TF, each being smaller than TF 40, are written with the electron beam 200, at a pitch P2 different from the arrangement pitch P1 in the x and y directions of TF 40 (small deflection region). Similarly to FIG. 5A, a plurality of figure patterns are respectively written in a plurality of TFs 40. For example, figure patterns are respectively written at the position in the upper part along the y direction and the right end part along the x direction in a TF 40, the position in the upper part along the y direction and the center part along the x direction in a TF 40, and position in the upper part along the y direction and the left end part along the x direction in a TF 40. These three figure patterns are repeatedly written in the x direction at the same pitch. It is preferable that when writing repeatedly, the position along the y direction remains at the same position without changing. Thereby, the figure patterns 61a to 63a, and 61b to 63b are arranged.

Similarly, figure patterns are respectively written at the position in the center part along the y direction and the right end part along the x direction of a TF 40, the position in the center part along the y direction and the center part along the x direction of a TF 40, and the position in the center part along the y direction and the left end part along the x direction of a TF 40. These three figure patterns are repeatedly written in the x direction at the same pitch. It is preferable that when writing repeatedly, the position along the y direction remains at the same position without changing. Thereby, the figure patterns 64a to 66a, and 64b to 66b are arranged.

Similarly, figure patterns are respectively written at the position in the lower part along the y direction and the right end part along the x direction in a TF 40, the position in the lower part along the y direction and the center part along the x direction in a TF 40, and the position in the lower part along the y direction and the left end part along the x direction in a TF 40. These three figure patterns are repeatedly written in the x direction at the same pitch. It is preferable that when writing repeated, the position along the y direction remains at the same position without changing. Thereby, the figure patterns 67a to 69a, and 67b to 69b are arranged.

In the example of FIG. 7A, a plurality of figure patterns 60 composed of the figure patterns 61 to 69 are written in two, upper and lower, rows. That is, a plurality of figure patterns 60b are written in the upper row, and a plurality of figure patterns 60a are written in the lower row.

Therefore, it is possible to respectively write a plurality of (for example, three each) figure patterns, each having a different writing position with respect to a TF 40, in a plurality of TFs 40, for example. In FIG. 7A, similarly to FIG. 5A, the writing is repeated three times so that three same patterns may be obtained, but it is not limited to three and may be a larger number of times.

According to Embodiment 2, in addition to writing a plurality of figure patterns 60 for evaluating TF as described above, a plurality of SF position dependency evaluation patterns 80 (the second figure pattern) for evaluating position dependency in SF 30 (an upper stage) being a deflection region larger than TF 40 are written such that their writing positions in the SF 30 are different from each other. In the example of FIG. 7A, for example, the SF position dependency evaluation patterns 80 are respectively written at nine (3×3) positions, as position dependency evaluation positions. As to the positions of the SF position dependency evaluation patterns 80, as shown in FIG. 7B, four (2×2) SF position dependency evaluation patterns 81 to 84 are written such that the reference position (for example, the lower left corner position) is arranged at the corner of TF 40 at each position, for example. The SF position dependency evaluation pattern 80 includes SF position dependency evaluation patterns 81 to 84. By the method described above, the SF position dependency evaluation patterns 80 can be respectively written at the position dependency evaluation position in SF 30. The SF position dependency evaluation patterns 81 to 84 may be the same patters as the figure patterns 60, or alternatively, may be patterns having a different size from that of the figure pattern 60 as long as they can be measured with a pattern position measuring instrument.

In the developing and etching step (S104), light-shielding film patterns corresponding to a plurality of figure patterns 60 for evaluating TF and light-shielding film patterns corresponding to a plurality of SF position dependency evaluation patterns 80 for evaluating the position dependency in SF 30 are obtained.

In the SF position dependency evaluation pattern measurement step (S106), first, the position of each of the SF position dependency evaluation patterns 80 (81 to 84) (light-shielding film patterns) formed on the evaluation substrate is measured with a pattern position measuring instrument.

In the judgment step (S108), first, with respect to the SF position dependency evaluation pattern 80 that was measured at each position dependency evaluation position in SF 30, an evaluation figure connecting positions 91 to 94 of the SF position dependency evaluation patterns 81 to 84 is generated for each SF position dependency evaluation pattern 80 as shown in FIG. 7C. Then, respective evaluation figures having been generated at position dependency evaluation positions (3×3 positions) in SF 30 are overlapped to judge whether there is a shift exceeding an allowable range between the evaluation figures or not. When there is no shift exceeding an allowable range between the evaluation figures, it means that no position dependent error has been generated in the SF 30 or only the error in the allowable range has been generated. In such a case, it goes to the TF evaluation pattern measurement step (S114).

When there is no shift exceeding an allowable range between the evaluation figures, similarly to Embodiment 1, the TF evaluation pattern measurement step (S114), the synthesis step (S116), and the n-th fitting step (S122) are executed. On the other hand, when there is a shift exceeding the allowable range between the evaluation figures, it goes to the first fitting step (S112).

In the first fitting steps (S112), for each SF position dependency evaluation pattern 80 measured at each position dependency evaluation position in SF 30, fitting is performed, by a polynomial, for a shift amount of each of the positions 91 to 94 of the SF position dependency evaluation patterns 81 to 84. For example, it is preferable to perform the fitting by a first-order polynomial. In other words, each coefficient of the polynomial can be obtained by approximating. For each position dependency evaluation position in SF 30, a shift amount ($\Delta x''$, $\Delta y''$) in TF 40 at the design coordinates (x, y), which is resulting from a position dependent error of SF 30, can be approximated by the following equations (3) and (4), for example.

$$\Delta x'' = c_0 + c_1 x + c_2 y \quad (3)$$

$$\Delta y'' = d_0 + d_1 x + d_2 y \quad (4)$$

By the method described above, a position dependent error in SF 30 is calculated by approximating, by a polynomial, the writing positions of a plurality of written SF position dependency evaluation patterns 80, using the writing positions of the SF position dependency evaluation patterns 81 to 84.

In the TF evaluation pattern measurement step (S115), each position of a plurality of figure patterns 60 (light-shielding film patterns) for TF evaluation formed on the evaluation substrate is measured with a pattern position measuring instrument.

In the SF position dependency correction step (S116), the writing position of each figure pattern 60 is corrected using a position dependent error of SF 30 which is close to the writing position of each written figure pattern 60. For example, with respect to the figure patterns 61a, 62a, 64a, and 65a configuring the figure pattern 60a in FIG. 7A, correction is performed based on the position dependent error at the position dependency evaluation position in the lower part along the y direction and the left end part along the x direction of the SF 30 shown by the outer frame in FIG. 7A. Similarly, with respect to the figure patterns 63a, 61b, 66a, and 64b configuring the figure pattern 60a, correction is performed based on the position dependent error at the position dependency evaluation position in the lower part along the y direction and the center part along the x direction of the SF 30. Similarly, with respect to the figure patterns 62b, 63b, 65b, and 66b configuring the figure pattern 60a, correction is performed based on the position dependent error at the position dependency evaluation position in the lower part along the y direction and the right end part along the x direction of the SF 30.

Similarly, with respect to the figure patterns 67a and 68a configuring the figure pattern 60a and the figure patterns 61a and 62a (not shown) configuring the figure pattern 60b, correction is performed based on the position dependent error at the position dependency evaluation position in the center part along the y direction and the left end part along the x direction of the SF 30. Similarly, with respect to the figure patterns 69a and 67b configuring the figure pattern 60a and the figure patterns 63a and 61b (not shown) configuring the figure pattern 60b, correction is performed based on the position dependent error at the position dependency evaluation position in the center part along the y direction and the center part along the x direction of the SF 30. Similarly, with respect to the figure patterns 68b and 69b configuring the figure pattern 60a and the figure patterns 62b and 63b (not shown) configuring the figure pattern 60b, correction is performed based on the position dependent error at the position dependency evaluation position in the center part along the y direction and the right end part along the x direction of the SF 30.

Similarly, with respect to the figure patterns 64a, 65a, 67a, and 68a (not shown) configuring the figure pattern 60b, correction is performed based on the position dependent error at the position dependency evaluation position in the upper part along the y direction and the left end part along the x direction of the SF 30. Similarly, with respect to the figure patterns 66a, 64b, 69a, and 67b (not shown) configuring the figure pattern 60b, correction is performed based on the position dependent error at the position dependency evaluation position in the upper part along the y direction and the center part along the x direction of the SF 30. Similarly, with respect to the figure patterns 65b, 66b, 68b, and 69b (not shown) configuring the figure pattern 60b, correction is performed based on the position dependent error at the position dependency evaluation position in the upper part along the y direction and the right end part along the x direction of the SF 30.

The correction method is to calculate a shift amount ($\Delta x''$, $\Delta y''$) resulting from the position dependency of SF 30, by substituting a measured relative position (x, y) in the TF 40 of each of the figure patterns 61 to 69 in the polynomial relating to the position dependency evaluation position concerned. Then, the position (x−Δx″, y−Δy″) obtained by subtracting the shift amount (Δx″, Δy″) from the measured relative position (x, y) is regarded as a measured relative position (x, y) after the correction, for example.

As described above, the shape error of TF 40 can further correct a position dependent error component occurred by a position dependent error of SF 30 by using a value of corrected position dependent error of SF 30. Hereafter, each step after the synthesis step (S120) is the same as that of Embodiment 1. That is, in the synthesis step (S120), the writing positions of a plurality of figure patterns 60 after the correction are synthesized.

As described above, according to Embodiment 2, it is possible to acquire a deflection region shape error of TF 40 in the situation where the position dependent error of SF 30 has been corrected. By using the method described above, a deflection region shape error can be acquired with high precision even when reduction of the deflection region is in progress.

Although a deflection region shape error of TF 40 in the situation where the position dependent error of SF 30 has been corrected is obtained in the example described above, it is also preferable to calculate a deflection region shape error of SF 30 by the same method while reading TF 40 as SF 30, and SF 30 as the main deflection region. In other words, it is also preferable to obtain a deflection region shape error of SF 30 in the situation where the position dependent error of the main deflection region has been corrected. Thus, it is preferable to apply the method described above to SF 30 which is the second largest after the largest deflection region (the main deflection region). According to Embodiment 2, similarly to Embodiment 1, the method described above is applied, when acquiring a deflection shape error of TF 40 for the third stage of three-stage deflection, to the writing apparatus 100 that deflects the electron beam 200 by three-stage deflection, and also, may be applied to the SF 30 being the second stage of the three stage deflection. Alternatively, the method described above may be applied to the SF 30 for the second stage of a writing apparatus employing two stage (main and sub) deflection. Further, the method described above may also be applied to the second, third, and fourth stages of a writing apparatus employing four or more stage deflection.

Embodiment 3

In the Embodiment 1 described above, a plurality of figure patterns 60 (evaluation patterns: the first figure patterns) for TF evaluation are written in one SF 30, and a deflection shape error of TF 40 is calculated in one SF 30, but however, it is not limited thereto. The configuration of the writing apparatus according to Embodiment 3 is the same as that of FIG. 1. Moreover, the flowchart showing the main steps of the writing method according to Embodiment 3 is the same as that of FIG. 3. Hereafter, the content of Embodiment 3 is the same as that of Embodiment 1 except for what is particularly described below.

Figure 10:
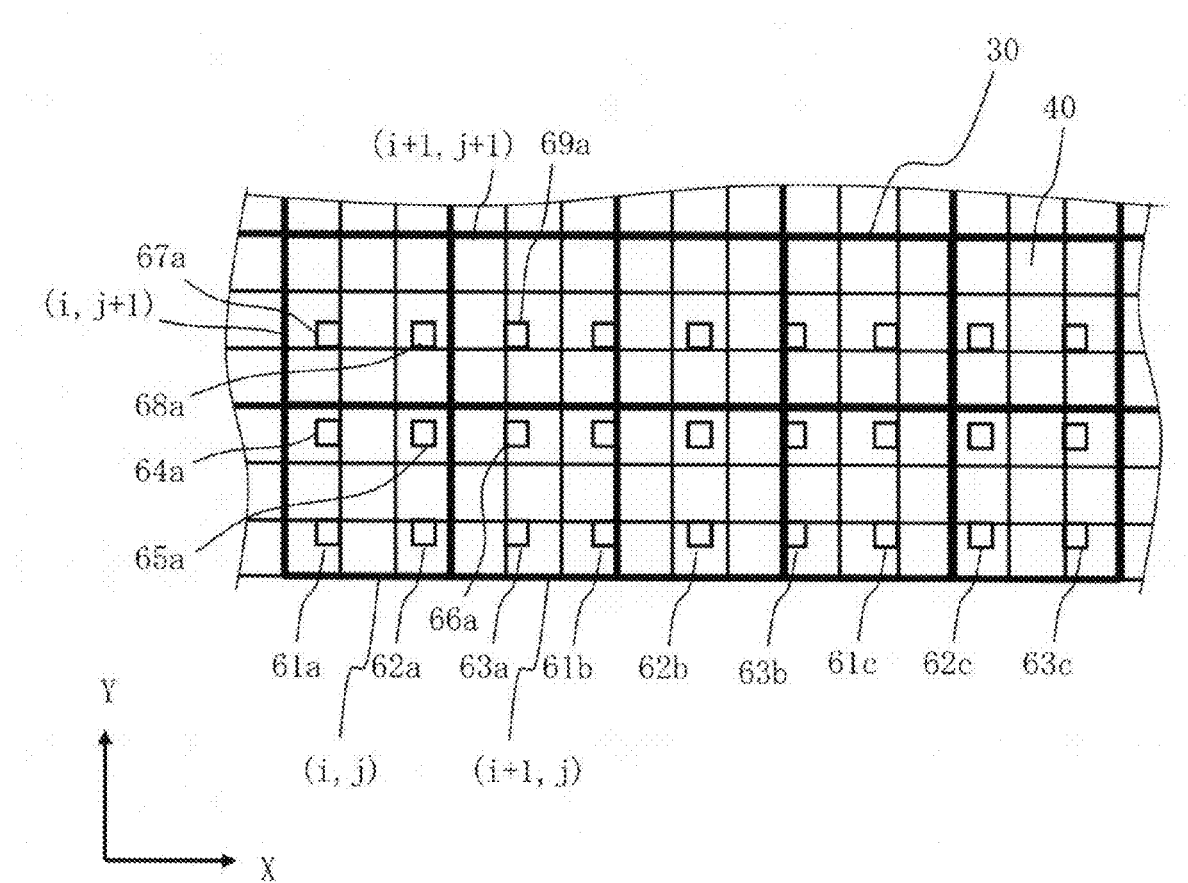
FIG. 10 is a schematic diagram showing an example of a writing method of an evaluation pattern, an example of a measurement position, and an example of a deflection shape according to Embodiment 3.

FIG. 10 is a schematic diagram showing an example of a writing method of an evaluation pattern, an example of a measurement position, and an example of a deflection shape according to Embodiment 3. As shown in FIG. 10, a plurality of figure patterns 60 (evaluation patterns: the first figure patterns) for evaluating TF, each being smaller than TF 40, are written with the electron beam 200, at a pitch P2 different from the dimension (arrangement pitch) P1 in the x and y directions of TF 40 (small deflection region, or the third deflection region). Here, according to Embodiment 3, the size of SF 30 (medium deflection region or the second deflection region) is set to be small. For example, the size of SF 30 is set to include several TFs 40 along the x and y directions, respectively. FIG. 10 shows the case in which totally nine TFs 40, namely three each in the x and y directions, are included in one SF 30. A plurality of figure patterns 60 are written such that they extend over a plurality of SFs 30. In the example of FIG. 10, a plurality of figure patterns 60 include the rectangular figure patterns 61 to 69, for example.

In the example of FIG. 10, quadrangular figure patterns 61 to 69 are written dividedly in a plurality of TFs 40 in the SF 30 at the coordinates (i,j), a plurality of TFs 40 in the SF 30 at the coordinates (i+1,j), a plurality of TFs 40 in the SF 30 at the coordinates (i, j+1), and a plurality of TFs 40 in the SF 30 at the coordinates (i+1, j+1).

For example, the figure pattern 61 is written at the position in the upper part along the y direction and the right end part along the x direction in a TF 40 in the SF 30 at the coordinates (i,j), the figure pattern 62 is written at the position in the upper part along the y direction and the center part along the x direction in another TF 40 in the SF 30 at the coordinates (i,j), and the figure pattern 63 is written at the position in the upper part along the y direction and the left end part along the x direction in a TF 40 in the SF 30 at the coordinates (i+1,j). Further, the figure pattern 64 is written at the position in the center part along the y direction and the right end part along the x direction in another TF 40 in the SF 30 at the coordinates (i,j), the figure pattern 65 is written at the position in the center part along the y direction and the center part along the x direction in another TF 40 in the SF 30 at the coordinates (i,j), and the figure pattern 66 is written at the position in the center part along the y direction and the left end part along the x direction in another TF 40 in the SF 30 at the coordinates (i+1,j). Furthermore, the figure pattern 67 is written at the position in the lower part along the y direction and the right end part along the x direction in a TF 40 in the SF 30 at the coordinates (i,j+1), the figure pattern 68 is written at the position in the lower part along the y direction and the center part along the x direction in another TF 40 in the SF 30 at the coordinates (i,j+1), and the figure pattern 69 is written at the position in the lower part along the y direction and the left end part along the x direction in a TF 40 in the SF 30 at the coordinates (i+1,j+1). Thereby, a plurality of figure patterns 61 to 69, each having a different writing position with respect to TF 40, can be written in a plurality of TFs 40 such that the figure patterns extend over a plurality of SFs at the coordinates (i,j), (i+1,j), (i,j+1), and (i+1,j+1), for example.

In the developing and etching step (S104), the evaluation substrate, on which a plurality of figure patterns 60 are written, is developed to form a resist pattern. Then, an exposed light-shielding film is etched by using the resist pattern as a mask. Then, the resist pattern is removed by means of ashing, etc. (not shown) so as to form a light-shielding film pattern on the evaluation substrate. By this method, a light-shielding film pattern, whose writing position with respect to TF 40 is different from each other, can be formed in each of a plurality of TFs 40, such that the film patterns extend over a plurality of SFs 30.

In the TF evaluation pattern measurement step (S114), the position of each light-shielding film pattern (figure pattern) formed on the evaluation substrate is measured with a pattern position measuring instrument.

In the synthesis step (S120), based on a positional relationship between the TF 40 including the position where a figure pattern concerned in the figure patterns 61 to 69 extending over a plurality of SFs 30 (the second deflection region) has been written and the position where the figure pattern concerned has been written, the writing positions of a plurality of figure patterns (the first figure patterns) are respectively synthesized in a corresponding TF 40.

Specifically, as shown in FIG. 4B, the figure pattern 61 (light-shielding film pattern) which has been written in one TF 40 in the SF 30 at the coordinates (i,j) is synthesized at the position 71 in the upper part along the y direction and the right end part along the x direction in a TF 40 for synthesis. The figure pattern 62 (light-shielding film pattern) which has been written in another TF 40 in the SF 30 at the coordinates (i,j) is synthesized at the position 72 in the upper part along the y direction and the center part along the x direction in the TF 40 for synthesis. The figure pattern 63 (light-shielding film pattern) which has been written in a TF 40 in the SF 30 at the coordinates (i+1,j) is synthesized at the position 73 in the upper part along the y direction and the left end part along the x direction in the TF 40 for synthesis. The figure pattern 64 (light-shielding film pattern) which has been written in another TF 40 in the SF 30 at the coordinates (i, j) is synthesized at the position 74 in the center part along the y direction and the right end part along the x direction in the TF 40 for synthesis. The figure pattern 65 (light-shielding film pattern) which has been written in another TF 40 in the SF 30 at the coordinates (i,j) is synthesized at the position 75 in the center part along the y direction and the center part along the x direction in the TF 40 for synthesis. The figure pattern 66 (light-shielding film pattern) which has been written in another TF 40 in the SF 30 at the coordinates (i+1,j) is synthesized at the position 76 in the center part along the y direction and the left end part along the x direction in the TF 40 for synthesis. The figure pattern 67 (light-shielding film pattern) which has been written in a TF 40 in the SF 30 at the coordinates (i,j+1) is synthesized at the position 77 in the lower part along the y direction and the right end part along the x direction in the TF 40 for synthesis. The figure pattern 68 (light-shielding film pattern) which has been written in another TF 40 in the SF 30 at the coordinates (i,j+1) is synthesized at the position 78 in the lower part along the y direction and the center part along the x direction in the TF 40 for synthesis. The figure pattern 69 (light-shielding film pattern) which has been written in a TF 40 in the SF 30 at the coordinates (i+1,j+1) is synthesized at the position 79 in the lower part along the y direction and the left end part along the x direction in the TF 40 for synthesis.

If there is no relative position error (deflection region shape error) between each figure pattern and the TF 40 having been used for synthesizing, they are arranged regularly to be three by three (3×3) in the horizontal and vertical directions as shown in FIG. 4B. However, if each figure pattern is written in a shifted manner, its position is also shifted. Therefore, as shown in FIG. 4C, each of the positions 71 to 79 having been synthesized is also shifted. The deflection region shape of TF 40, which is ideally a square, becomes a distorted shape as shown in FIG. 4C.

In the n-th fitting step (S122), a deflection region shape error of TF 40 is calculated by approximating each shift amount of the writing positions 71 to 79 of a plurality of figure patterns that have been written, by a polynomial. For example, it is preferable to perform approximation by the third-order polynomial respectively with respect to the x and y directions. In other words, each coefficient of the polynomial is obtained by approximation. The shift amount (Δx', Δy') resulting from the deflection shape error of TF 40 on the design coordinates (x, y) can be approximated by the above equations (1) and (2), for example.

As described above, a shape error in the case of writing a pattern in a TF 40 is calculated by using the writing position of each synthesized figure pattern. Then, a polynomial or a coefficient of the polynomial which indicates an obtained deflection region shape error of TF 40 is output as TF shape error data. The output TF shape error data is input into the writing apparatus 100 and stored in the storage device 142.

As described above, according to Embodiment 3, the influence of a position dependent error in SF 30 can be made small by calculating a deflection region shape error of TF 40 based on the data obtained concerning a plurality of SFs 30. As a result, it is possible to highly precisely acquire a deflection region shape error of TF 40 even without writing the SF position dependency evaluation patterns 81 to 84 explained in Embodiment 2. In the case of using the method according to Embodiment 3, the size of SF 30 needs to be equal to or larger than the size of TF 40. When the sizes of TF 40 and SF 30 are the same, the SF position dependency can be completely removed.

Embodiments have been explained referring to concrete examples described above. However, the present invention is not limited to these specific examples. For example, Embodiment 1 is not limited to be applied to one of deflection regions of multi-stage to be deflected by a multi-stage deflector. It is also preferable to apply Embodiment 1 to the case of performing single stage deflection by a single-stage deflector. Moreover, for example, it is also preferable to apply Embodiment 2 or 3 to the deflection region of the second (or more) stage in deflection regions of multi-stage to be deflected by a multi-stage deflector.

While the apparatus configuration, control method, etc. not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other acquisition method of a charged particle beam deflection shape error, a charged particle beam writing method and a charged particle beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An acquisition method of a charged particle beam deflection shape error comprising:
    writing a plurality of figure patterns, each being smaller than a deflection region of a plurality of deflection regions, with a charged particle beam, at a pitch different from an arrangement pitch of the plurality of deflection regions arranged to be deflected by a deflector that deflects the charged particle beam;
    synthesizing writing positions of the plurality of figure patterns into one virtual deflection region of a same size as the deflection region, based on a positional relationship between the deflection region including a position where a figure pattern concerned of the plurality of figure patterns has been written and the position where the figure pattern concerned has been written; and calculating a shape error in a case of writing a pattern in the deflection region, using a synthesized writing position of each of the plurality of figure patterns, and outputting the shape error.

2. The method according to claim 1,
wherein the deflector is a two or more stage deflector, each stage of which deflects a region having a different size from that to be deflected by another stage, and
for the shape error of the deflection region, a value obtained by correcting a position dependent error of an upper stage deflection region larger than the deflection region concerning the shape error is used.

3. The method according to claim 1,
wherein the deflector is a two or more stage deflector, each stage of which deflects a region having a different size from that to be deflected by another stage, and
the deflection region is second largest in size after a largest deflection region.

4. The method according to claim 1,
wherein the deflector is a three stage deflector, deflection regions deflected by which are a first deflection region, a second deflection region, and a third deflection region from larger to smaller, and the third deflection region corresponds to the deflection region, the first deflection region corresponds to the largest deflection region, and the plurality of figure patterns are written such that they extend over a plurality of the second deflection regions.

5. The method according to claim 4, further comprising:
synthesizing the writing positions of the plurality of figure patterns into one small deflection region, based on a positional relationship between a small deflection region including a position where a figure pattern concerned in the plurality of figure patterns written such that they extend over the plurality of the second deflection regions has been written and the position where the figure pattern concerned has been written.

6. The method according to claim 1,
wherein an arrangement pitch of the plurality of figure patterns is larger than the arrangement pitch of the plurality of deflection regions.

7. The method according to claim 6,
wherein the arrangement pitch of the plurality of figure patterns is smaller than an integral multiple, twice or more times, of the arrangement pitch of the plurality of deflection regions.

8. The method according to claim 1,
wherein the plurality of figure patterns are respectively written in an upper part along y direction and a left part along x direction in one of the plurality of deflection regions, in the upper part along y direction and a center part along x direction in another one of the plurality of deflection regions, and in the upper part along y direction and a right part along x direction in another one of the plurality of deflection regions;
in a center part along y direction and a left part along x direction in one of the plurality of deflection regions, in the center part along y direction and a center part along x direction in another one of the plurality of deflection regions, and in the center part along y direction and a right part along x direction in another one of the plurality of deflection regions; and
in a lower part along y direction and a left part along x direction in one of the plurality of deflection regions, in the lower part along y direction and a center part along x direction in another one of the plurality of deflection regions, and in the lower part along y direction and a right part along x direction in another one of the plurality of deflection regions.

9. The method according to claim 1,
wherein the shape error is calculated as a deflection region shape error of the deflection region.

10. A charged particle beam writing method comprising:
correcting a writing position by using a shape error that is acquired by the acquisition method of a charged particle beam deflection shape error according to claim 1; and
writing a pattern at a corrected writing position with a charged particle beam.

11. The method according to claim 10,
wherein a shift amount caused by the shape error is approximated by a polynomial, a shift amount from a design writing position is calculated by substituting the design writing position in the polynomial, and the writing position is corrected to be a position obtained by subtracting a calculated shift amount from the design writing position.

12. An acquisition method of a charged particle beam deflection shape error comprising:
writing, with a charged particle beam, a plurality of first figure patterns each being smaller than a third deflection region, at a pitch different from an arrangement pitch of the third deflection region which is one of a first deflection region, a second deflection region, and the third deflection region, from larger to smaller, respectively deflected by a three stage deflector that deflects the charged particle beam, and writing a plurality of second figure patterns for evaluating position dependency in the second deflection region such that the plurality of second figure patterns are written at different positions in the second deflection region;
calculating a position dependent error in the second deflection region by using writing positions of the plurality of second figure patterns that have been written;
correcting a writing position of each of the plurality of first figure patterns that have been written, by using a position dependent error of the second deflection region close to the writing position of each of the plurality of the first figure patterns that have been written;
synthesizing a corrected writing position of each of the plurality of first figure patterns into a virtual third deflection region of a same size as the third deflection region, based on a positional relationship between the third deflection region including a position where a first figure pattern concerned has been written and the position where the first figure pattern concerned has been written; and
calculating a shape error in a case of writing a pattern in the third deflection region by using a synthesized writing position of each of the plurality of first figure patterns, and outputting the shape error.

13. The method according to claim 12,
wherein the shape error is calculated as a deflection region shape error of the third deflection region.

14. The method according to claim 13,
wherein an arrangement pitch of the plurality of first figure patterns is larger than the arrangement pitch of the third deflection region.

15. The method according to claim 14,
wherein the arrangement pitch of the plurality of first figure patterns is smaller than an integral multiple, twice or more times, of the arrangement pitch of the third deflection region.

16. The method according to claim 14,
wherein the plurality of first figure patterns are respectively written in an upper part along y direction and a left part along x direction in one of a plurality of third deflection regions, in the upper part along y direction and a center part along x direction in another one of the plurality of third deflection regions, and in the upper part along y direction and a right part along x direction in another one of the plurality of third deflection regions;
in a center part along y direction and a left part along x direction in one of the plurality of third deflection regions, in the center part along y direction and a center part along x direction in another one of the plurality of third deflection regions, and in the center part along y direction and a right part along x direction in another one of the plurality of third deflection regions; and
in a lower part along y direction and a left part along x direction in one of the plurality of third deflection regions, in the lower part along y direction and a center part along x direction in another one of the plurality of third deflection regions, and in the lower part along y direction and a right part along x direction in another one of the plurality of third deflection regions.

* * * * *